ELECTRONIC DEVICE WITH METAL PIN UNITED TO
METALLIZED CERAMIC SURFACE
Filed April 15, 1969

Prior Art

INVENTOR
Philip S. Hessinger
by Greene and Durr
ATTORNEYS

United States Patent Office 3,522,487

Patented Aug. 4, 1970

3,522,487

ELECTRONIC DEVICE WITH METAL PIN UNITED TO METALLIZED CERAMIC SURFACE

Philip S. Hessinger, West Caldwell, N.J., assignor to National Beryllia Corp., Haskell, N.J., a corporation of New Jersey Filed Apr. 15, 1969, Ser. No. 816,340
Int. Cl. H05k 3/32
U.S. Cl. 317—101 4 Claims

ABSTRACT OF THE DISCLOSURE

The invention relates to a metal pin of the type which is to be butt-soldered to a metallized surface of a ceramic wafer or base plate of an electronic device and to the resultant electronic device, the metal pin being formed with a necked-down portion close to the surface of the head that is to be soldered to said metallized surface so that it can be bent readily during assembling of the device or will bend before failing if accidentally subjected to stress after assembling.

This invention relates to electronic devices such as transistors, diodes, microcircuits, etc., which have a metal pin butt-connected to a metallized, insulating ceramic plate or wafer as by brazing or soldering.

Problems arise when rigid metallic pins are brazed to metallized ceramic surfaces due to thermal stresses developed at the interface due to expansion differences, etc. Thus, if such metal pins are stressed, as by applying a bending force thereto as a part of the subsqeuent processing or by accident, the joint fails. Pins having high ductility, such as those made of silver or oxygen-free copper will usually bend before the butt-brazed joint to metallized ceramic fails, but pins of nickel, iron, steel, ordinary copper and alloys of these metals, frequently fail at the joint between the pin and the ceramic when a bending stress is applied thereto, especially if such pins have a diameter greater than about 0.035 to 0.04″. Many devices require pins having a diameter in excess of 0.04″ and it is important that the body of the pin remain a heavy cross-section so that the current carrying capability of the package is not reduced.

Among the objects of the invention is to provide an improved pin for butt uniting to a metallized insulating base.

Among other objects of the invention is to provide an improved combination of a metallized ceramic base with at least one butt-united metal pin thereon.

The objects of the invention are attained by providing the pins for uniting to a metallized ceramic with a "necked-down" portion adjacent the head, when is to be united to the metallized surface of the ceramic base.

The pins can be made of any metal desired. As indicated, the invention is particularly useful where pins are made of less ductile metals, i.e., exclusive of silver or oxygen free copper, but even with the latter type of pins, the invention has advantages where pins of fairly large diameters are desirable in the particular circuit involved.

Ceramic bases to which the pins can be united (after a surface of the ceramic has been metallized) include beryllia, silica, alumina, magnesia, xirconia and various mixtures of said oxides, spinels, mullite, glass bonded mica, titanates, talc, steatite, etc.

The surface of the ceramic plate or wafer can be metallized by conventional processes, i.e., by vapor desposition of the metal, by depositing a dispersion or solution of a salt or oxide of the metal and reducing the same, by depositing a dispersion of the metal and firing, by adhering a metal foil to the surface, etc.

The metal head of the pin may be butt-united to the metallized surface of the ceramic by soldering, brazing, welding, etc.

Further objects and features of the invention will be apparent from the reading of the subjoined specification and claims and from a consideration of the accompanying drawing showing an embodiment of the invention.

Figure 1:
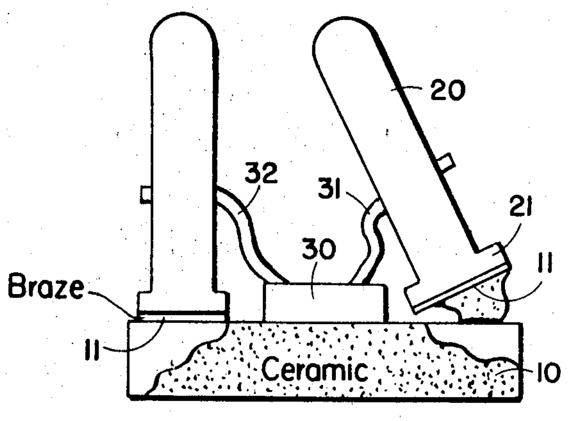
FIG. 1 is a side view of a prior art device which has failed, due to a force being applied to one of the pins.
Figure 2:
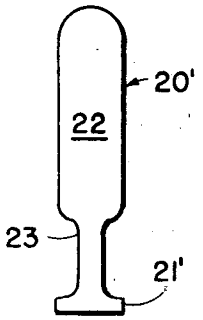
FIG. 2 is a side view of a pin made according to this invention.

As shown in FIG. 1, a prior art device could comprise the ceramic base 10, one or more pins 20 united to the top metallized surface of ceramic 10 by a brazing or soldering metal 11, and one or more circuit elements 30 connected to the pins 20 by conductors 31, 32. It is not uncommon to provide pins 20 with an enlarged head 21 to provide greater contact area between the pin and the metallized surface of ceramic 10. If this is done, the head must be kept thin also, e.g., less than about .01″ between the lower surface of the head and the beginning of the necked down portion.

The pin 21′ of the invention comprises a shank portion 22 of uniform diameter, a head 21′ which may be of the same diameter as the shank portion 22 or it may be larger or even somewhat smaller, and a necked-in portion 23 starting close to the surface of the head, which has a diameter of around .02″ to less than 0.04″.

Figure 3:
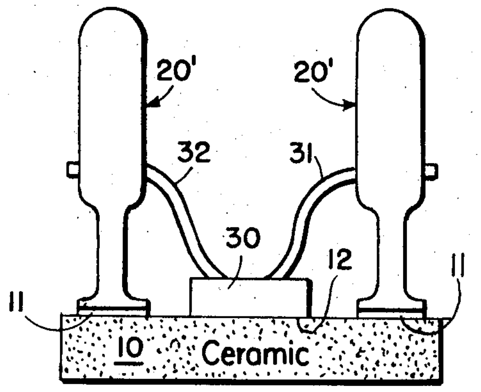
FIG. 3 is a view of a composite device made according to the invention.
Figure 4:
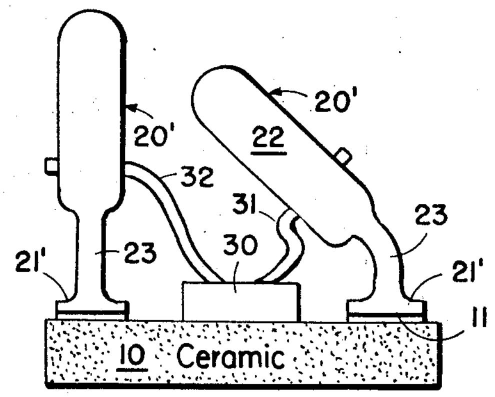
FIG. 4 is a view similar to FIG. 3 but showing how bond failure is avoided with said device of FIG. 3.

When one or more pins 20′ are assembled to provide a composite structure, as shown in FIGS. 3 and 4, there is no failure of the bond between the head 21′ and the base 10 when a pin 20′ is subjected to a transverse force as shown in FIG. 4.

EXAMPLE

In a typical device, a beryllia base in a shape shown in FIG. 3, is metallized on the top surface 12 by duplication of molybdenum-manganese compositions which are fired then in hydrogen at 1400–1600° C. The metallized layer is then nickel plated and ready for brazing. The pins 20′ are brazed in place with the aid of a silver-copper eutectic braze. The part is then gold plated by a conventional electro-plating or electroless gold plating process. The device is then soldered in place using gold-silicon or gold-germanium alloy. Finally, wires are soldered or compression bonded to the silicon device and then welded to the vertical pin. In many cases, it is necessary to bend the pin 20′ out of the way when working on other parts of the device, and then bend it back afterwards.

The device 30 in such a composite may be a transistor, a thermister, a chip of doped metal, an electrode of a capactitor, etc. After suitable connections are made between pins 20′ and the circuit 30, the device is ready for use, and in use, in accidental movement of the pins 20′ results only in the pins bending at the necked portion 23, while the brazed bond 11 between the base 10 and the head 21′ of the pin 20′ remains intact.

I claim:

1. In an electronic device of the type having a ceramic base plate with a metallized portion to which a metal pin is butt-united, an improved pin having a headed portion for uniting to the metallized portion of the base plate, a shank portion of a size greater than about .04″ and a necked-in portion adjacent the headed portion, said necked-in portion having a diameter of about .02″ to less than .04″.

2. The improved pin as claimed in claim 1 wherein the necked-in portion starts no more than .01" from the surface of the headed portion.

3. In combination, a ceramic base plate, and electric circuit element disposed on one surface of said base plate, a portion of said ceramic base plate being metallized, at least one metal pin having a head which is butt-united to a metallized portion of said base plate, said metal pin having a shank portion of a diameter greater than about .04" and having a necked-in portion adjacent said head portion that has a diameter of about .02" to less than .04", means electrically connecting a part of the electronic circuit element to said pin.

4. The combination as claimed in claim 3 wherein the head of the metal pin is butt-united to the metallized portion of the ceramic plate by a braze.

References Cited

UNITED STATES PATENTS

| | | |
|---|---|---|
| 2,174,682 | 10/1939 | Beggs. |
| 2,603,711 | 7/1952 | Woodyard. |

DARRELL L. CLAY, Primary Examiner

U.S. Cl. X.R.

174—68.5; 339—17